(12) United States Patent
Chiku et al.

(10) Patent No.: US 10,156,587 B2
(45) Date of Patent: Dec. 18, 2018

(54) CURRENT DETECTING DEVICE AND CURRENT DETECTING RESISTOR

(71) Applicant: KOA CORPORATION, Ina-shi, Nagano (JP)

(72) Inventors: Satoshi Chiku, Nagano (JP); Takanori Kikuchi, Nagano (JP)

(73) Assignee: KOA CORPORATION, Nagano (JP)

( * ) Notice: Subject to any disclaimer, the term of this patent is extended or adjusted under 35 U.S.C. 154(b) by 0 days.

(21) Appl. No.: 15/516,179

(22) PCT Filed: Oct. 22, 2015

(86) PCT No.: PCT/JP2015/079760
§ 371 (c)(1),
(2) Date: Mar. 31, 2017

(87) PCT Pub. No.: WO2016/063928
PCT Pub. Date: Apr. 28, 2016

(65) Prior Publication Data
US 2017/0307658 A1    Oct. 26, 2017

(30) Foreign Application Priority Data

Oct. 22, 2014 (JP) .................. 2014-215255

(51) Int. Cl.
*H02J 1/00* (2006.01)
*G01R 1/20* (2006.01)
(Continued)

(52) U.S. Cl.
CPC ............ *G01R 1/203* (2013.01); *G01R 15/14* (2013.01); *G01R 19/0092* (2013.01);
(Continued)

(58) Field of Classification Search
CPC .. H02J 1/00; H02M 1/00; H01L 21/00; H01L 2221/00; G01R 1/00
See application file for complete search history.

(56) References Cited

U.S. PATENT DOCUMENTS

2003/0020592 A1\*  1/2003  Hirasawa ............... G01R 1/203
                                                                  338/49
2009/0174522 A1    7/2009  Schulz et al.
(Continued)

FOREIGN PATENT DOCUMENTS

| JP | 2008-082957 A | 4/2008 |
| JP | 2009-135286 A | 6/2009 |
| JP | 2012-233706 A | 11/2012 |

OTHER PUBLICATIONS

International Search Report, and English language translation thereof, in corresponding International Application No. PCT/JP2015/079760, dated Dec. 22, 2015, 9 pages.

*Primary Examiner* — Jermele M Hollington
*Assistant Examiner* — Temilade Rhodes-Vivour
(74) *Attorney, Agent, or Firm* — Brinks Gilson & Lione

(57) ABSTRACT

Provided is a current detecting device comprising a current detecting resistor including a pair of electrodes and a resistive element; a pair of lands on which the current detecting resistor is adapted to be mounted; connection portions adapted to connect the two electrodes and the two lands, respectively; and a pair of wires connected to the two respective electrodes and adapted to detect a voltage. Positions where the two wires are connected to the two respective electrodes are located in regions on a further inner side than inner ends of the connection portions.

7 Claims, 18 Drawing Sheets

(51) Int. Cl.
*G01R 15/14* (2006.01)
*G01R 19/00* (2006.01)
*H01C 1/148* (2006.01)
*H01C 1/16* (2006.01)
*H02M 1/00* (2006.01)

(52) U.S. Cl.
CPC ............. *H01C 1/148* (2013.01); *H01C 1/16* (2013.01); *H01L 2221/00* (2013.01); *H02J 1/00* (2013.01); *H02M 1/00* (2013.01)

(56) References Cited

U.S. PATENT DOCUMENTS

| | | | | |
|---|---|---|---|---|
| 2011/0285498 A1* | 11/2011 | Yoneda | ................. | H01C 1/014 338/306 |
| 2012/0080952 A1* | 4/2012 | Yoshikuni | ................. | H02J 1/10 307/52 |
| 2013/0264710 A1* | 10/2013 | Osugi | ................. | H01L 27/0814 257/741 |
| 2014/0125429 A1* | 5/2014 | Yoshioka | ................. | H01C 1/14 333/172 |
| 2014/0266568 A1* | 9/2014 | Cheng | ................. | G01R 1/203 338/314 |

* cited by examiner

CURRENT DETECTING DEVICE AND CURRENT DETECTING RESISTOR

This application is a 371 application of PCT/JP2015/079760 having an international filing date of Oct. 22, 2015, which claims priority to JP2014-215255 filed Oct. 22, 2014, the entire contents of which are incorporated herein by reference.

TECHNICAL FIELD

The present invention relates to a current detecting technique.

BACKGROUND ART

It is well known that a chip resistor with quite a low resistance value, which is as low as milliohm, is commonly used to detect current. A chip resistor includes, for example, a resistive element produced from a noble metal alloy or other metal alloy, highly conductive electrodes, and a meltable solder material.

Patent Literature 1 described below discloses a mount structure of a current detecting resistor.

CITATION LIST

Patent Literature

Patent Literature 1: JP 2012-233706 A

SUMMARY OF INVENTION

Technical Problem

FIG. 13 is a side view illustrating an exemplary mount structure of a shunt resistor as an example of a current detecting device (current detecting resistor) described in Patent Literature 1.

On a metal substrate 102 made of aluminum or the like on which a shunt resistor 100 is to be mounted, there are provided wire patterns 103a and 103b, which are formed on the metal substrate 102 and are adapted to pass current through the resistor 100, a resistive element 101 provided between the wire patterns 103a and 103b, and solder layers 105a and 105b connecting the resistive element 101 to the wire patterns 103a and 103b, respectively. There are also provided a pair of voltage detecting wires 107a and 107b that are formed on the substrate 102 and are adapted to detect a voltage generated across opposite ends of the shunt resistor 100. Examples of the shunt resistor 100 include resistors for which Cu—Mn-based or Ni—Cr-based metal materials are used.

The voltage detecting wires 107a and 107b are connected at voltage detection positions at opposite ends of the shunt resistor 100 via bonding wires 109a and 109b, respectively.

A current I to be detected flows through the shunt resistor 100, and a voltage V, which is equal to the current I multiplied by the resistance value R of the shunt resistor 100, is taken out to a voltage detecting circuit (not illustrated) from the voltage detecting wires 107a and 107b.

By the way, with a reduction in the size of components and an increase in the amount of current flowing therethrough, the current density in the product part has been increasing. With an increase in the current density, a problem of generation of electromigration in the solder joint portions has become noticeable. The possibility of the generation of electromigration is particularly high in a portion where the temperature is high and the current density is high.

In the structure of FIG. 13, current is concentrated in portions 111 indicated by circles, in particular. If the device is used for a long period of time in such a state, the solder layers 105a and 105b in the portions 111 indicated by circles may disappear due to electromigration. Consequently, the L dimension of the resistive element becomes long, and thus the potential difference between the bonding wires 109a and 109b, which are voltage detecting terminals, becomes large. That is, the resistance value will drift toward a higher value.

Therefore, if the current detecting device (current detecting resistor) is used for a long period of time, such as ten years, for example, a favorable current detection accuracy of the device is difficult to maintain, which is problematic.

FIG. 14 is a side view illustrating an exemplary configuration of a resistor with a so-called butt joint structure where a resistive element 201 and electrodes 205a and 205b are connected together in the perpendicular direction. Reference numerals 203a and 203b denote wire patters. Reference numerals 206a and 206b denote solder layers. Reference numerals 209a and 209b denote bonding wires. Even in a resistor with such a butt joint structure, the detection accuracy may decrease due to the influence of TCR (range indicated by reference numeral 221) of the Cu electrode if bonding is performed as illustrated in FIG. 9.

A first object of the present invention is to maintain a favorable current detection accuracy of a current detecting device over a long period of time. A second object of the present invention is to provide a high-precision resistor for use in such a current detecting device.

Solution to Problem

According to an aspect of the present invention, there is provided a current detecting device including a current detecting resistor including a pair of electrodes and a resistive element; a pair of lands on which the current detecting resistor is adapted to be mounted; connection portions adapted to connect the two electrodes and the two lands, respectively; and a pair of wires connected to the two respective electrodes and adapted to detect a voltage. Positions where the two wires are connected to the two respective electrodes are located in regions on a further inner side than inner ends of the connection portions.

Ends of the pair of electrodes and the resistive element may be butt-joined together.

Each electrode may have a difference in height between a side connected to the resistive element and a side connected to one of the lands.

At least one of the two electrodes may have a protruding face that is thicker than the resistive element and have a difference in height from a surface of the resistive element, and one of the wires may be connected to the protruding face.

According to the present invention, there is also provided a current detecting resistor including a resistive element; a pair of electrodes fixed on the resistive element; and a protruding portion that allows the resistive element to protrude from a side portion of the resistor.

According to the present invention, there is also provided a current detecting resistor including a resistive element; a pair of electrodes fixed on the resistive element; and a metal film formed over the resistive element and the electrodes. The resistive element is partially exposed from the metal film.

The present specification contains the disclosure of the Japanese patent application JP 2014-215255 that serves as a basis for priority claim of the present application.

Advantageous Effects of Invention

According to the present invention, a favorable current detection accuracy of a current detecting device can be maintained over a long period of time.

DETAILED DESCRIPTION OF THE PREFERRED EMBODIMENTS

Hereinafter, embodiments of the present invention will be described in detail with reference to the drawings.
(First Embodiment)

Figure 1A:
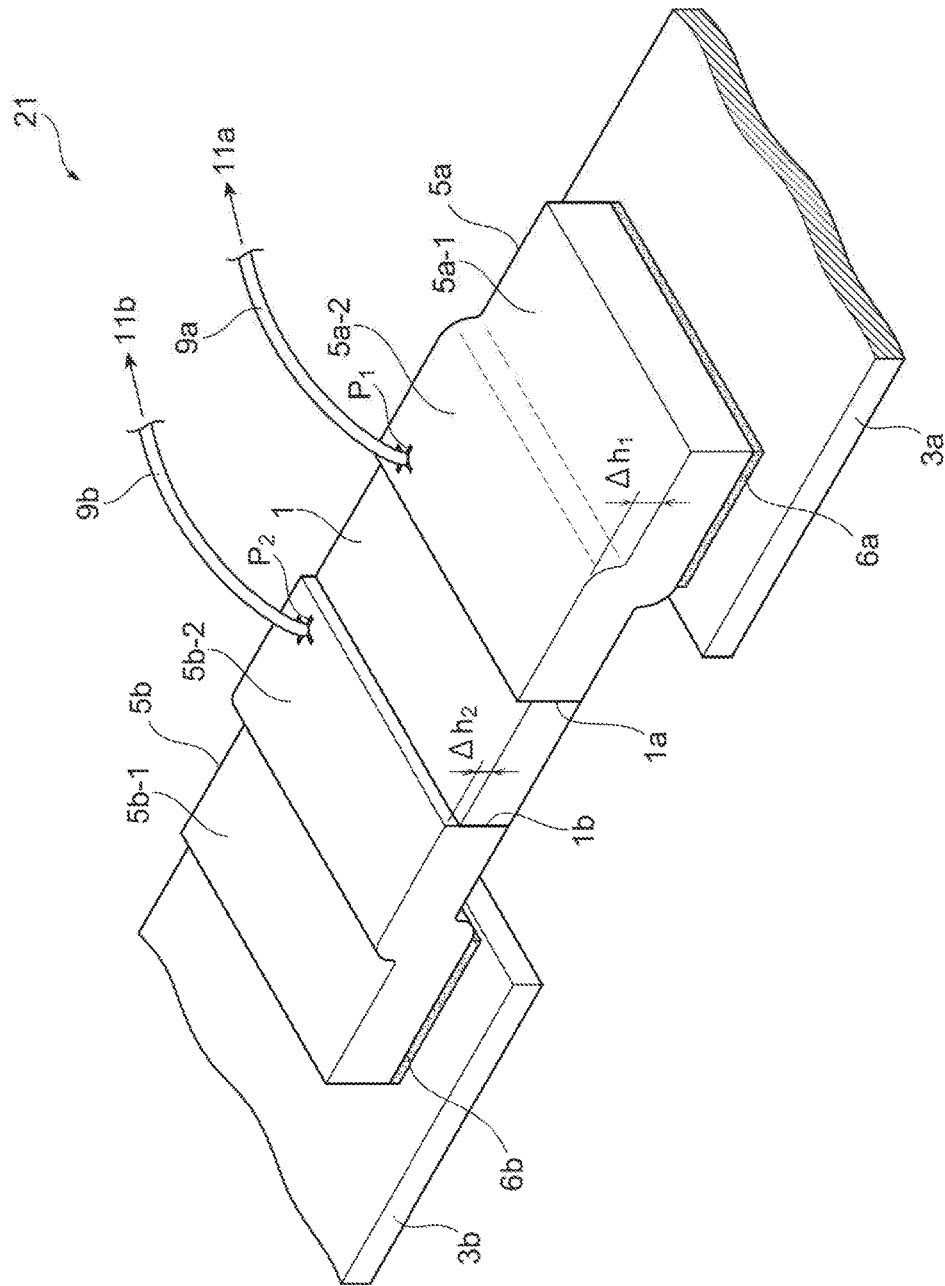
FIG. 1A is a perspective view illustrating an exemplary configuration of a current detecting device in accordance with a first embodiment of the present invention.
Figure 1B:
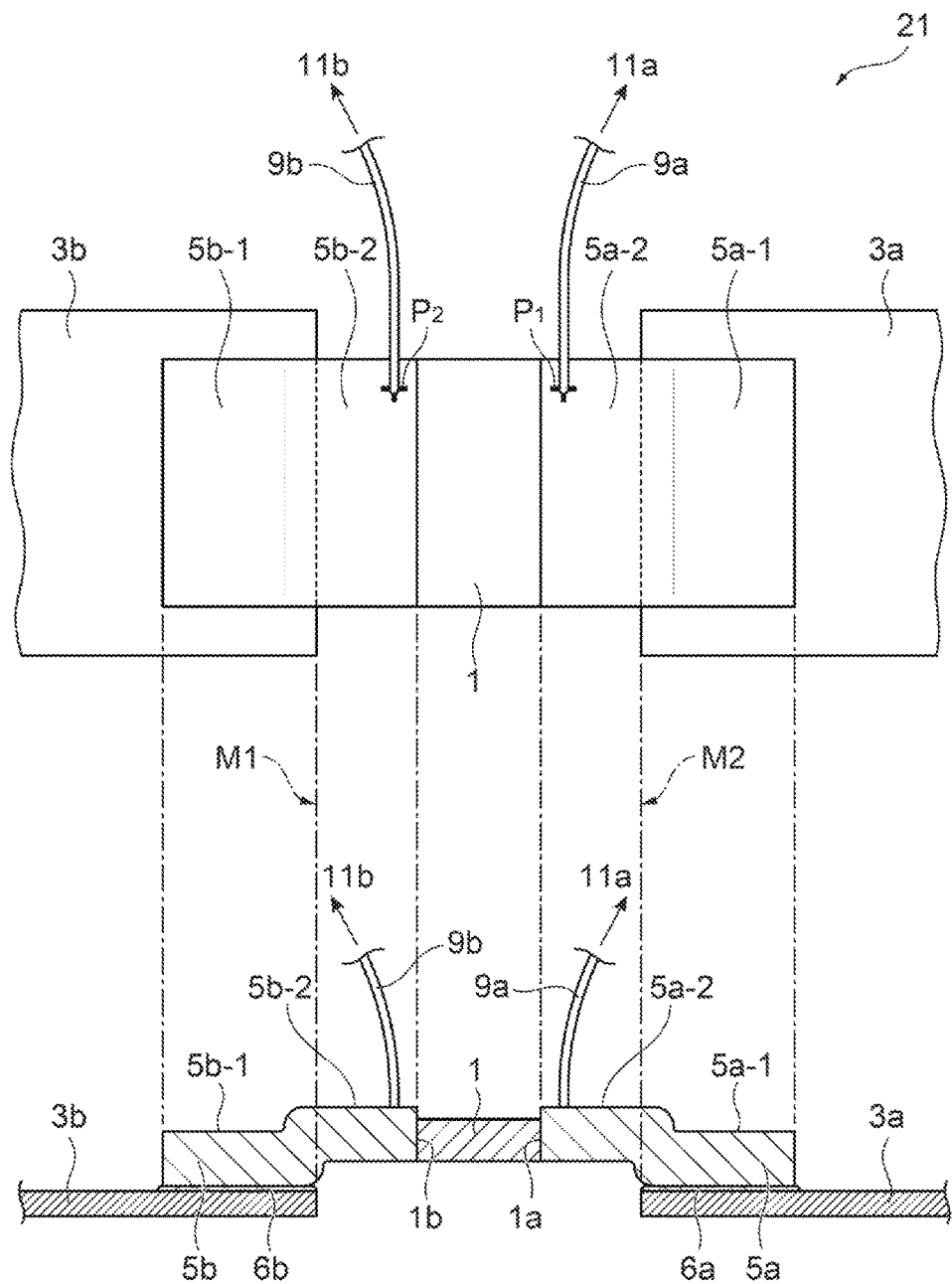
FIG. 1B is a plan view and a cross-sectional view of the current detecting device corresponding to FIG. 1A.

FIG. 1A is a perspective view illustrating an exemplary configuration of a current detecting device in accordance with a first embodiment of the present invention. FIG. 1B is a plan view and a cross-sectional view of the current detecting device corresponding to FIG. 1A.

A current detecting device 21 has wire patterns 3a and 3b that are formed on a metal substrate (not illustrated), for example, and are adapted to pass current across opposite ends of a current detecting resistor having a resistive element 1. The current detecting resistor is formed by joining the resistive element 1, which is made of a Cu-Ni-based material or the like, to electrodes 5a and 5b made of Cu or the like. Connection materials that form connection portions 6a and 6b for connecting terminal portions 5a-1 and 5b-1 of the electrodes 5a and 5b to the wire patterns 3a and 3b, respectively, are solder layers formed of Sn—Ag—Cu solder, for example. For the connection materials, an electrically conducting adhesive, a brazing material, or the like can also be used other than solder. With respect to the influence of electromigration, the present invention is particularly effective when Sn-based connection materials are used, for example. It should be noted that the connection portions indicate portions where the terminal portions 5a-1 and 5b-1 and the wire patterns 3a and 3b are connected, respectively, either directly through resistance welding or the like or indirectly via solder or the like, and thus solder or the like may be either provided or not.

In addition, in the current detecting device 21, a pair of voltage detecting wires 11a and 11b (not illustrated), which are formed above the substrate and are adapted to detect a voltage generated across opposite ends of the resistor, are connected at voltage detection positions P1 and P2 of the electrodes 5a and 5b via bonding wires 9a and 9b. The bonding wires 9a and 9b function as the voltage detecting terminals. The opposite ends 1a and 1b of the resistive element 1 of the resistor (it should be noted that reference numerals 1a and 1b may also indicate joint portions of the resistive element and the electrodes) are connected to sidewalls of the electrodes 5a and 5b, respectively. The resistive element 1 is made of metal such as Cu—Ni-based, Cu—Mn—Ni-based, or Ni—Cr-based metal, for example.

In the structure of FIG. 1A, the electrodes 5a and 5b have terminal portions (lower portions) 5a-1 and 5b-1, which are regions on the end side, and regions (upper portions) 5a-2 and 5b-2 that are continuous with the terminal portions 5a-1 and 5b-1 and are located on the resistive element 1 side. A difference in height Δh1 is provided between such regions. That is, each of the electrodes 5a and 5b has a difference in height between the side connected to the resistive element 1 and the side connected to the land 3a or 3b. The surface of the resistive element 1 is lower than the surfaces of the regions 5a-2 and 5b-2 on the resistive element 1 side by a difference in height Δh2.

The terminal portions 5a-1 and 5b-1 and the wire patterns 3a and 3b are connected together via solder 6a and 6b, respectively. At least one of the electrodes 5a or 5b is thicker than the resistive element 1, and has a protruding face (5a-2 or 5b-2) having a difference in height from the surface of the resistive element 1. The wires 9a and 9b are connected to the protruding faces (5a-2 and 5b-2), respectively.

In FIG. 1B, lines indicated by reference symbols M2 and M1 show inner ends of the connection portions 6a and 6b connecting the terminal portions 5a-1 and 5b-1 to the wire patterns 3a and 3b, respectively. The connection portion of the bonding wire 9a in the region 5a-2 is located on the inner side than the portion indicated by reference symbol M2, that is, on the side closer to the resistive element 1. In addition, the connection portion of the bonding wire 9b in the region 5b-2 is located on the inner side than the portion indicated by reference symbols Ml, that is, on the side closer to the resistive element 1. That is, the connection portions of the bonding wires 9b and 9a are not located on the outer side than the portions indicated by reference symbols M1 and M2, that is, not located in the regions (regions 5a-1 and 5b-1) in which the solder layers (connection portions) 6a and 6b are formed.

Figure 2:
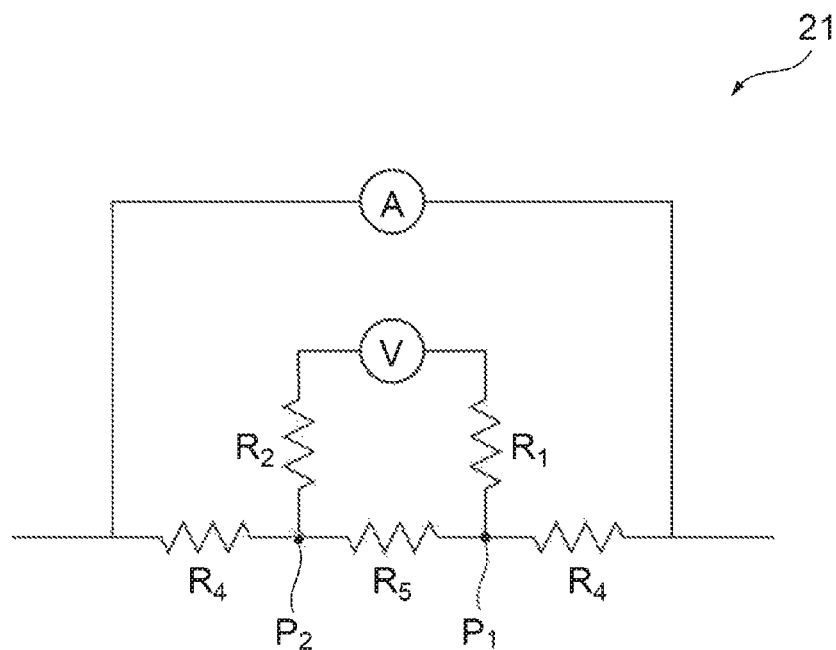
FIG. 2 is an equivalent circuit diagram where measurement is conducted at four terminals with the structure illustrated in FIG. 1A.

FIG. 2 is an equivalent circuit diagram where measurement is conducted at four terminals with the structure illustrated in FIGS. 1A and 1B. In the resistor of the current detecting device 21, even when the solder 6a and 6b are scraped away in the direction opposite to the resistive element 1 (in the direction in which the distance between the solder layers is increased), the distance between the voltage detection positions P1 and P2 remains unchanged because the voltage detecting wires 11a and 11b are connected at the voltage detection positions P1 and P2 directly or indirectly via the bonding wires 9a and 9b, which function as the voltage detecting terminals, on a further inner side than the inner ends of the soldered regions, as illustrated in FIGS. 1A and FIG. 1B. Thus, the resistance value of R5 does not change. Meanwhile, when a current is passed straight across the voltage detection positions P1 and P2, the voltage detection positions P1 and P2 do not change, while the distance between the opposite inner ends of the soldered regions becomes long, but the solder tends to be scraped away with the inner ends maintained parallel with each other. Thus, there is almost no influence of changes with time on the potential distribution within the resistive element 1.

Thus, according to the current detecting device in this embodiment, even when solder has been scraped away due to the influence of electromigration, and the resistance value of the resistor in the mounted state has changed, current detection performed through measurement at the four terminals is unlikely to be influenced thereby. Therefore, there is an advantage in that favorable current detection accuracy can be maintained over a long period of time.

Further, as illustrated in FIG. 1A, as the difference in height Δh1 is provided between the terminal portions (lower portions) 5a-1 and 5b-1, which are regions on the end side, and the regions (upper portions) 5a-2 and 5b-2 that are continuous with the terminal portions 5a-1 and 5b-1 and are located on the resistive element 1 side, it is possible to reduce the possibility that wires may be erroneously bonded to the terminal portions (lower portions) 5a-1 and 5b-1, which are regions on the end side, when wire bonding is attempted to be performed on the regions (upper portions) 5a-2 and 5b-2 on the resistive element 1 side. Further, as the surface of the resistive element 1 is lower than the surfaces of the regions 5a-2 and 5b-2 on the resistive element 1 side by the difference in height Δh2, it is possible to reduce the possibility that wires may be erroneously bonded to the surface of the resistive element 1. That is, selectivity of the wire bonding positions is improved with the use of the difference in height.

(Second Embodiment)

Hereinafter, a method for producing the current detecting device in accordance with the first embodiment will be described with reference to the drawings.

Figure 3A:
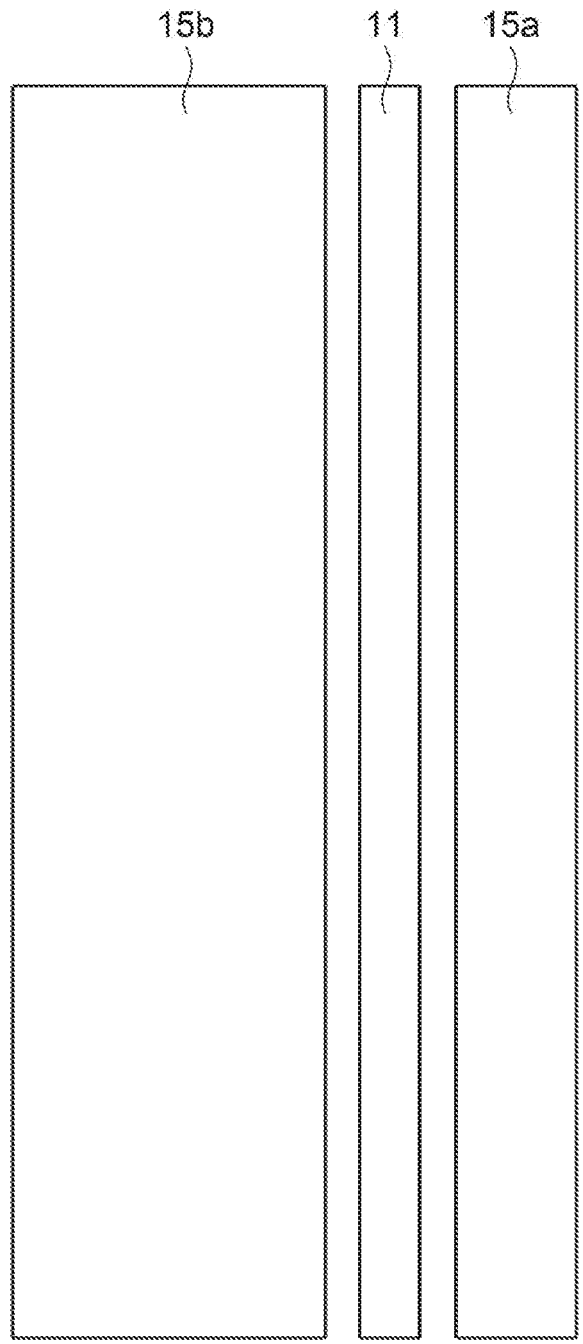
FIG. 3A is a view of a step illustrating a method for producing a current detecting device in accordance with a second embodiment.
Figure 3B:
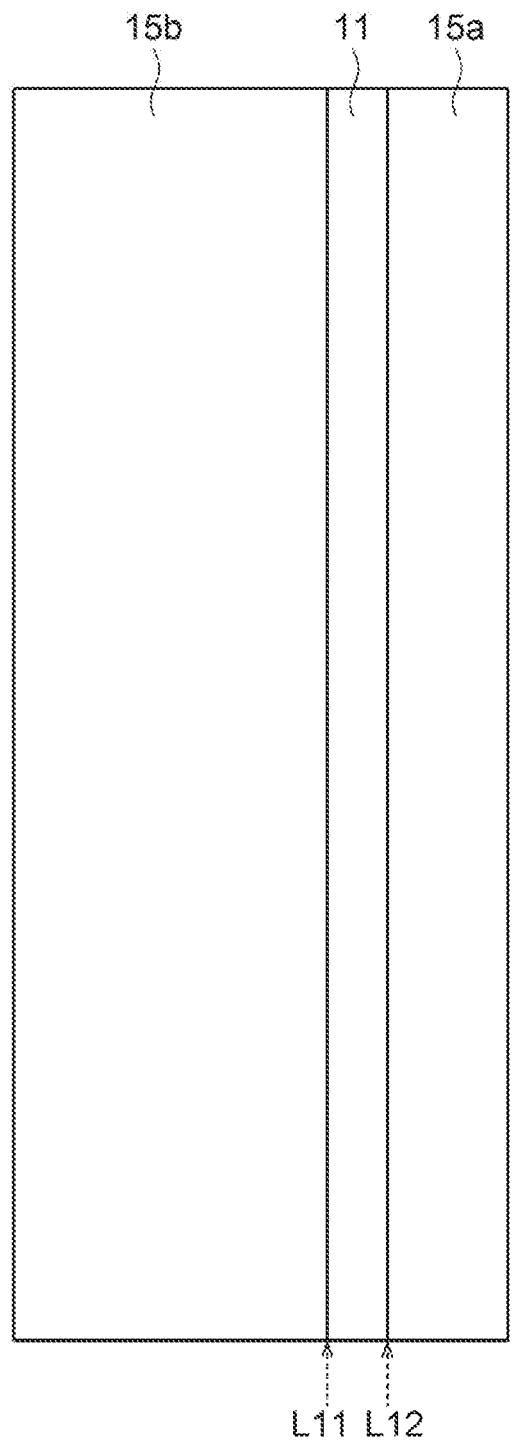
FIG. 3B is a view of a step illustrating a method for producing the current detecting device in accordance with the second embodiment.
Figure 3C:
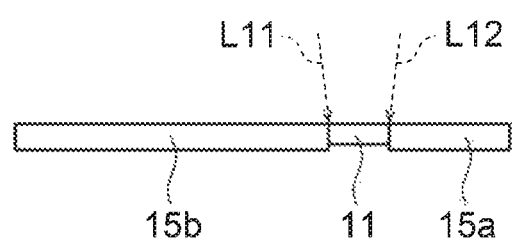
FIGS. 3C(a) and 3C(b) are views of a step illustrating a method for producing the current detecting device in accordance with the second embodiment.
Figure 3C:
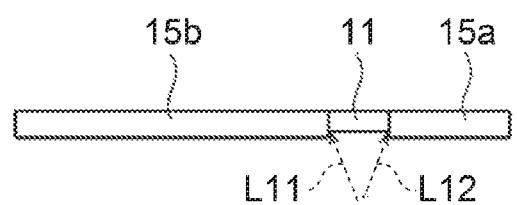

As illustrated in FIG. 3A, for example, a resistive material 11 in the shape of a long flat plate or the like as well as a first electrode material 15a and a second electrode material 15b, each of which is also in the shape of a long flat plate or the like similarly to the resistive material 11, are prepared, and the first electrode material 15a and the second electrode material 15b are disposed on opposite sides of the resistive material 11 as illustrated in FIG. 3B. Then, the materials are welded together using an electron beam or a laser beam, for example, to form a single flat plate (connected at L11 and L12). At this time, portions irradiated with an electron beam or the like are those illustrated in FIG. 3C(a) or FIG. 3C(b). FIG. 3C(a) illustrates an example in which a side of a flat surface formed by the electrode materials 15a and 15b and the resistive element 11 is irradiated with an electron beam or the like. FIG. 3C(b) illustrates an example in which the inner sides of a recess formed by the electrode materials 15a and 15b and the resistive element 11 are irradiated with an electron beam or the like. Faces of the electrode materials 15a and 15b that protrude beyond the resistive element 11 are controlled so as not to be irradiated with an electron beam or the like so that the influence of the electron beam irradiation is reduced. In order to form a structure close to that in FIG. 3B, it is also possible to form long through-holes in the electrode materials and join a long resistive material to the electrode materials through the long through-holes. It is also possible to adjust the resistance value by utilizing the difference in thickness between the resistive material 11 and the electrode materials 15a and 15b. Further, the difference in height (Δh2) described below can also be formed. A variety of adjustments for the resistance value and shapes can also be performed with the joint positions controlled.

Figure 3D:
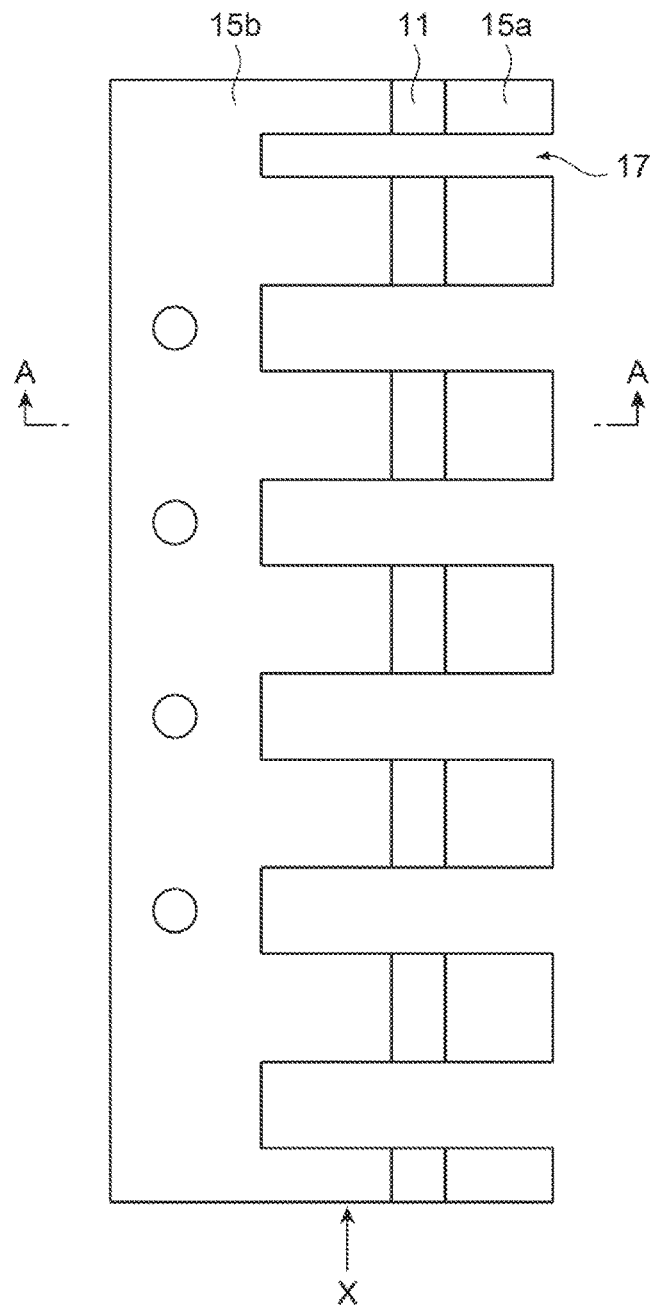
FIGS. 3D(a) and 3D(b) are views of a step illustrating a method for producing the current detecting device in accordance with the second embodiment.
Figure 3D:
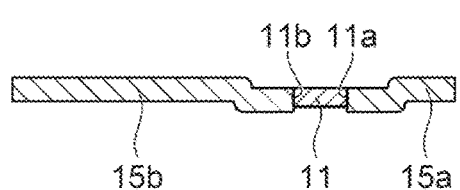
Figure 3E:
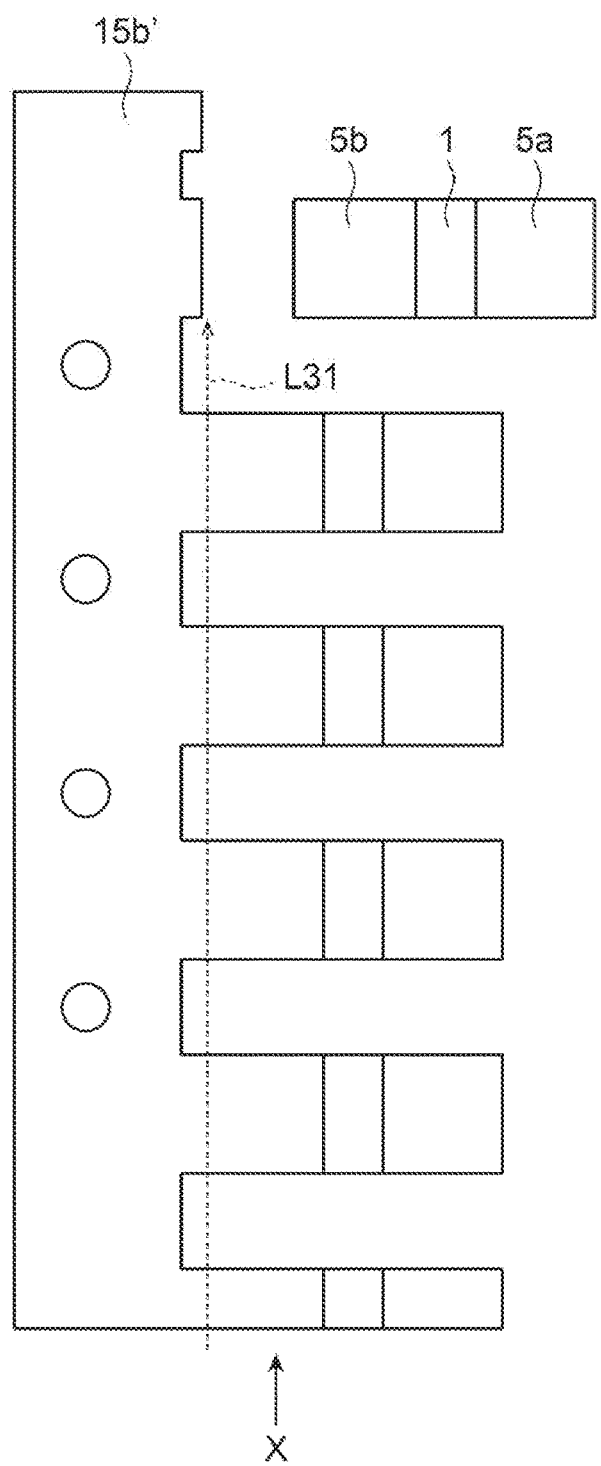
FIG. 3E is a view of a step illustrating a method for producing the current detecting device in accordance with the second embodiment.

Next, as illustrated in FIG. 3D(a), the flat plate is stamped into a comb shape as indicated by reference numeral 17, for example, from the state in FIG. 3B, by removing a region including the resistive element 11. Next, the first electrode material 15a and the second electrode material 15b are partially bent with a press or the like to form a structure with a cross-sectional shape illustrated in the lower view of FIG. 1B, as illustrated in the cross-sectional view of FIG. 3D(b). Next, a portion of the electrode on the other end side (5b), which has not been cut away, is cut away from the remaining region (proximal portion) 15b' along L31 as illustrated in FIG. 3E. Accordingly, a resistor with a butt joint structure for use in the current detecting device in accordance with the first embodiment can be formed. Using the production method in accordance with this embodiment is advantageous in that it allows for the mass production of resistors.

Figure 3F:
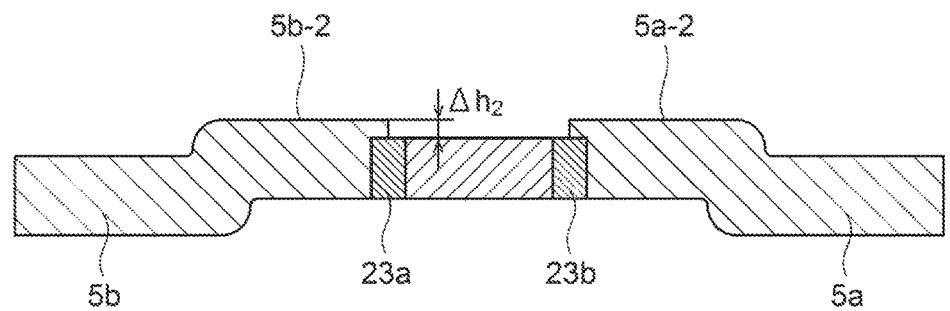
FIG. 3F is a view of a step illustrating a method for producing the current detecting device in accordance with the second embodiment.

It should be noted that welding spots 23a and 23b are formed in the resistor as illustrated in FIG. 3F. Typically, the surface of a welding spot formed by an electron beam or the like is rough. In order to precisely detect current, bonding wires are preferably fixed at positions as close as possible to the resistive element. However, the welding spots may become obstructions at this time. According to this embodiment, welding spots can be prevented from being formed in the regions 5a-2 and 5b-2 that are the surfaces on which wires are to be bonded with the method described in detail with reference to FIGS. 3C(a) and 3C(b). Therefore, there is an advantage in that wires can be fixed at positions close to the resistive element.

(Third Embodiment)

Figure 4:
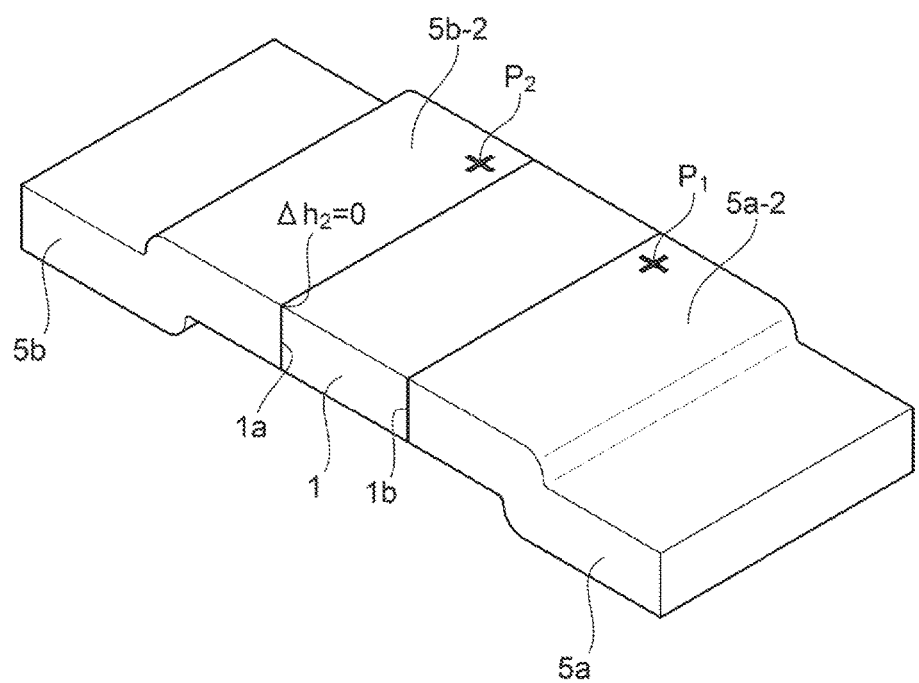
FIG. 4 is a perspective view illustrating an example of a resistor that can be used for a current detecting device in accordance with a third embodiment.

Hereinafter, a current detecting device in accordance with a third embodiment will be described with reference to the drawings. FIG. 4 is a perspective view illustrating an example of a resistor that can be used for the current detecting device in accordance with this embodiment. The resistor illustrated in FIG. 4 is different from that illustrated in FIG. 1A in that there is no difference in height between the surfaces of the regions 5a-2 and 5a-2 on the resistive element 1 side of the electrodes 5a and 5b and the surface of the resistive element 1. As the resistor has a butt joint structure, the boundaries between the resistive element and the electrodes may not be clearly seen. However, instead, bonding positions are made clear such that the target positions P1 and P2 for wire bonding are indicated by markers (indicated by + marks, for example) or the surfaces of the areas around the target positions P1 and P2 are smoothed through punching or polishing so that bonding can be easily performed.

(Fourth Embodiment)

Figure 5:
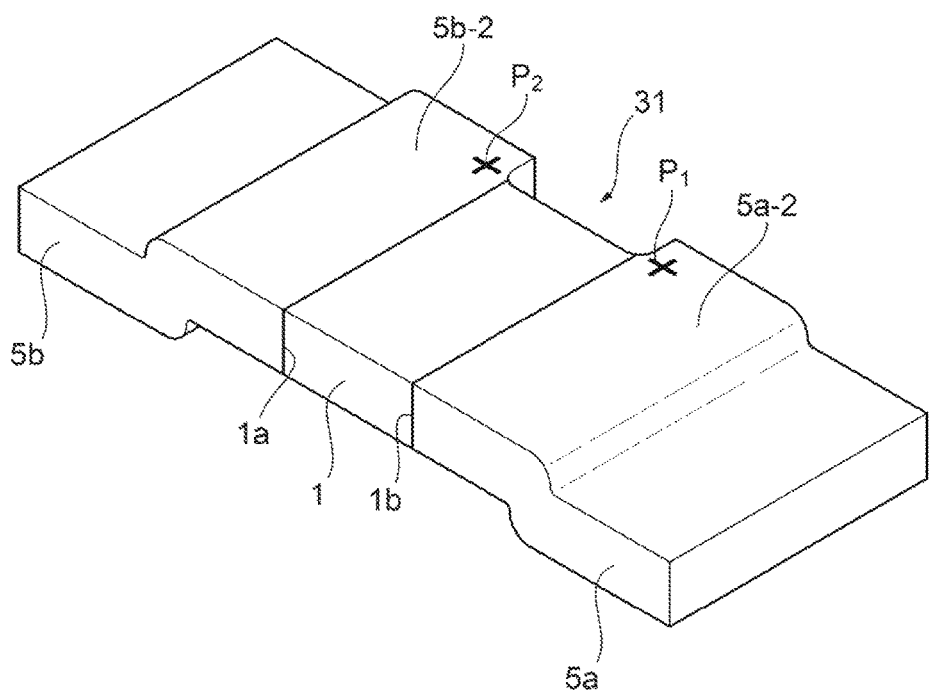
FIG. 5 is a perspective view illustrating an example of a resistor that can be used for a current detecting device in accordance with a fourth embodiment.

Hereinafter, a current detecting device in accordance with a fourth embodiment will be described in detail with reference to the drawings. FIG. 5 is a perspective view illustrating an example of a resistor that can be used for the current detecting device in accordance with this embodiment. The resistor illustrated in FIG. 5 is different from that illustrated in FIG. 1A in that a recess portion 31 is formed on an exposed side face of the resistive element 1. With such a recess portion 31 provided, the resistance value can be adjusted. As the resistor has a butt joint structure, the boundaries 1a and 1b between the resistive element 1 and the electrodes 5a and 5b may not be clearly seen. However, wire bonding targeted at P1 and P2 can be performed using the recess portion 31 as a reference mark. The recess portion 31 can be formed in a state in which individual pieces of the resistor are partially connected together (FIGS. 3D(a) and 3D(b)) or after the individual pieces are separated through cutting.

(Fifth Embodiment)

Figure 6A:
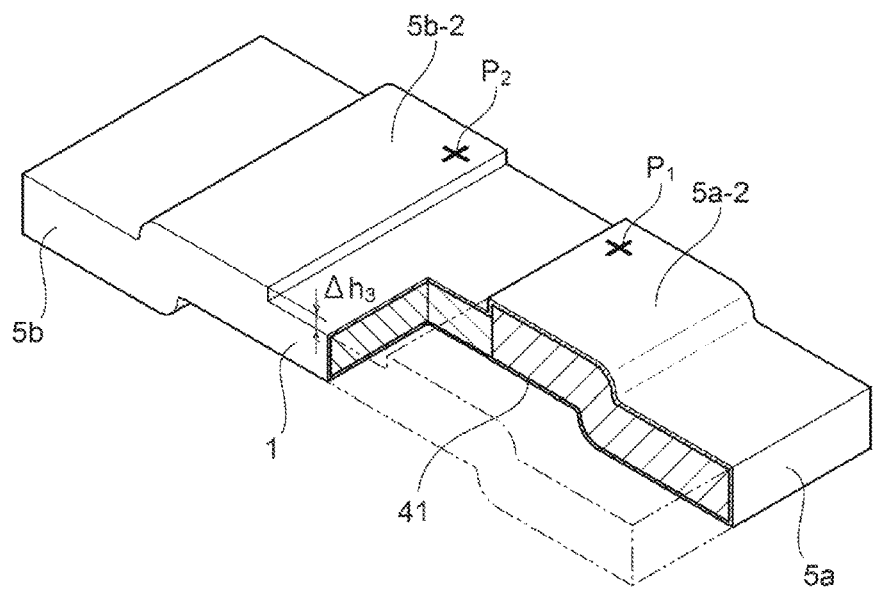
FIG. 6A is a perspective view illustrating a first example of a resistor that can be used for a current detecting device in accordance with a fifth embodiment.

Hereinafter, a current detecting device in accordance with a fifth embodiment will be described with reference to the drawings. FIG. 6A is a perspective view illustrating a first example of a resistor that can be used for the current detecting device in accordance with this embodiment.

The resistor illustrated in FIG. 6A is different from that illustrated in FIG. 1A in that a metal film 41 is formed by plating the entire resistor with metal such as Ni—P.

In this structure, as the resistor has a butt joint structure and the entire resistor is covered with the film 41, the boundaries between the resistive element 1 and the electrodes 5a and 5b may not be clearly seen. However, in this embodiment, as a difference in height $\Delta h3$, which serves as a mark of the boundaries between the resistive element 1 and the electrodes 5a and 5b, is provided between the surface of the resistive element 1 and the regions (upper portions) 5a-2 and 5b-2 of the electrodes 5a and 5b on the resistive element 1 side as in FIG. 3F, there is an advantage in that alignment in wire bonding can be easily performed. It should be noted that the film 41 may also be partially formed. For example, the film 41 may be formed on connection portions connecting the electrodes 5a and 5b and the wire patterns, or at positions to be connected to bonding wires as indicated by reference numerals 5a-2 and 5b-2.

Figure 6B:
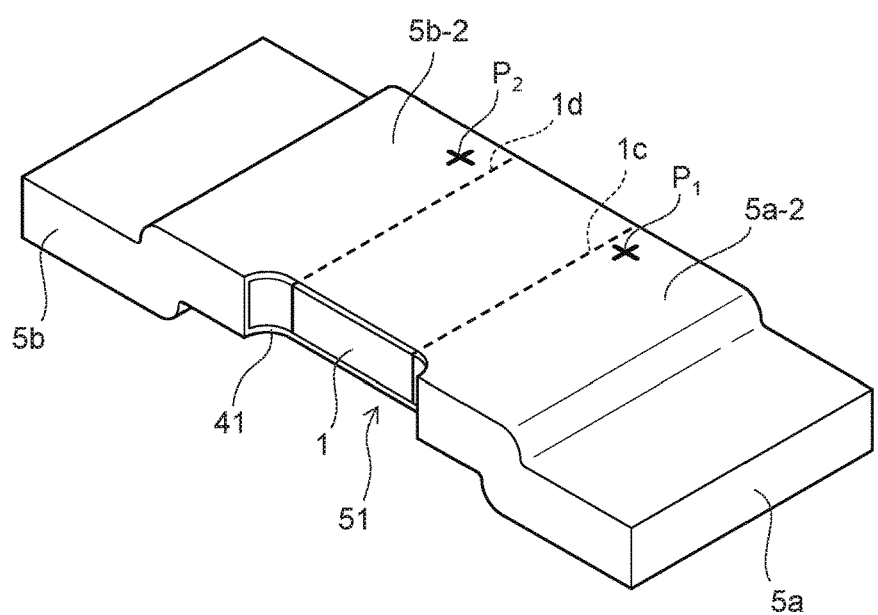
FIG. 6B is a perspective view illustrating a second example of a resistor that can be used for a current detecting device in accordance with the fifth embodiment.

FIG. 6B is a perspective view illustrating a second example of a resistor that can be used for a current detecting device in accordance with the fifth embodiment. This resistor includes a resistive element 1 and a pair of electrodes 5a and 5b fixed on the resistive element 1.

The resistor illustrated in FIG. 6B has a structure in which an electrically conductive metal film 41 is formed on almost the entire surface of the resistor excluding a part thereof. In other words, the structure is the one in which the electrically conductive metal film 41 is formed over the electrodes 5a and 5b and the resistive element 1. Reference symbols $P_1$ and $P_2$ are reference positions to be used for connecting wires or marks indicating the reference positions. When an electrically conductive metal film is formed on the entire surface, fluctuations in the resistance value will occur. Therefore, such fluctuations in the resistance value are preferably adjusted.

It should be noted that even when the metal film 41 is formed, the joint portions (welded portions) 1c and 1d of the resistive element 1 and the electrodes 5a and 5b can be identified from their appearances as indicated by the dotted lines. This is because the surfaces of the welded portions 1c and 1d are irregular. This is also true of the subsequent figures.

When the metal film 41 is formed, the resistance value may change. Therefore, the resistance value should be adjusted after the electrically conductive film is formed.

FIG. 6B illustrates an example in which the resistive element portion of the resistor is partially cut out so that the resistance value is adjusted. Specifically, the structure in FIG. 6B can be implemented by measuring the resistance value of the resistor before the step of partially cutting out the resistive element so as to determine the amount of adjustment of the resistance value, calculating the amount of cutout corresponding thereto, and forming a cutout 51 on a side face of the resistive element 1.

Alternatively, it is also possible to determine the width of the resistive element in advance in accordance with a target product to be produced, and form a cutout with a corresponding width to that of the resistive element.

As a method for forming a cutout, a method of stamping the plate or a method of grinding the plate with a grinder or the like can be used, for example. In such a case, the cutout 51 can also be formed using the visible joint portions (welded portions) 1c and 1d as marks.

Through the aforementioned steps, a structure is obtained where the resistive element 1 is partially exposed on a side portion of the resistor. In addition, as a cutout is formed in a region including parts of the electrode portions, side faces of the electrodes 5a and 5b are also partially exposed.

According to this embodiment, when a structure where the entire surface of a resistor is plated is used, the resistance value can be adjusted by forming a cutout. Besides the structure where a cutout is formed on a side portion of the resistor, it is also possible to ground the top face or the bottom face portion of the resistor, for example. In such a case, the resistive element 1 and as well as the electrodes 5a and 5b are partially exposed on the top face or the bottom face of the resistor.

(Sixth Embodiment)

Figure 7:
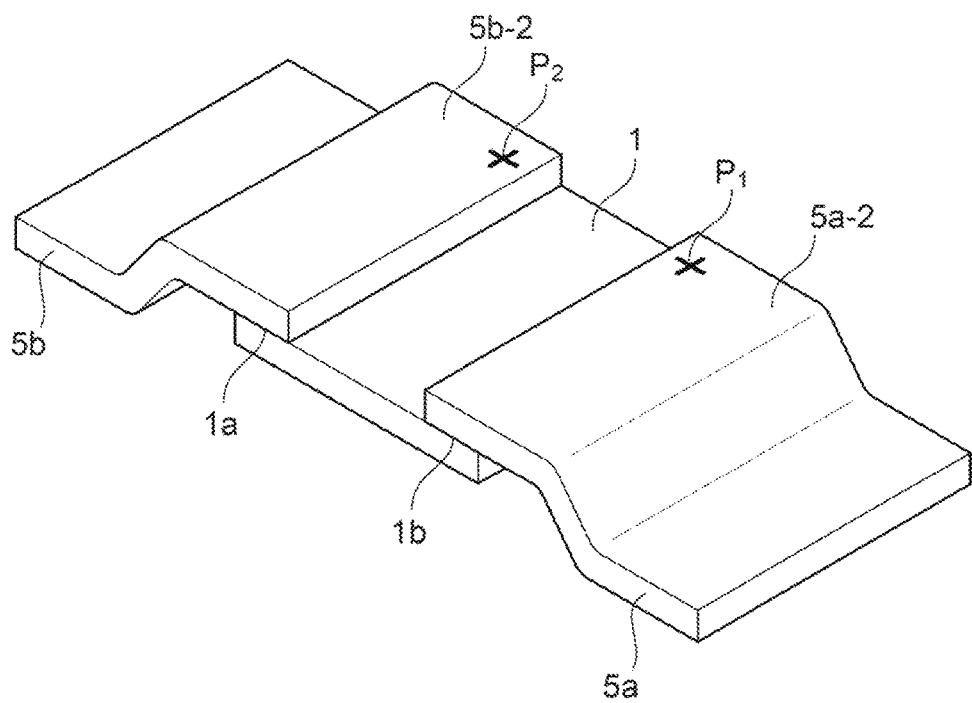
FIG. 7 is a perspective view illustrating an example of a resistor that can be used for a current detecting device in accordance with a sixth embodiment.

Hereinafter, a current detecting device in accordance with a sixth embodiment will be described with reference to the drawings. FIG. 7 is a perspective view illustrating an example of a resistor that can be used for the current detecting device in accordance with this embodiment. The resistor illustrated in FIG. 7 is different from that illustrated in FIG. 1A in that the resistor does not have a butt joint structure, but has a structure where each electrode and the resistive element are joined together by being laid one on top of the other in layers at portions indicated by reference numerals 1a and 1b in FIG. 7.

Even in such a case, a difference in height is provided at the boundaries between the resistive element 1 and the regions (upper portions) 5a-2 and 5b-2 of the electrodes 5a and 5b on the resistive element 1 side. Therefore, alignment can be easily performed at P1 and P2 in wire bonding.

(Seventh Embodiment)

Hereinafter, a current detecting device in accordance with the seventh embodiment will be described with reference to the drawings.

A structure where a recess is formed on a side portion of a resistor for adjustment of the resistance value has been exemplarily described with reference to FIG. 6B. However, with such a structure, there is a possibility that if the size of the resistor is small, in particular, an area where wire bonding can be performed may become narrow or a plating film may crack during machining, which would otherwise cause problems with the surface state of the bonding area.

Figure 8A:
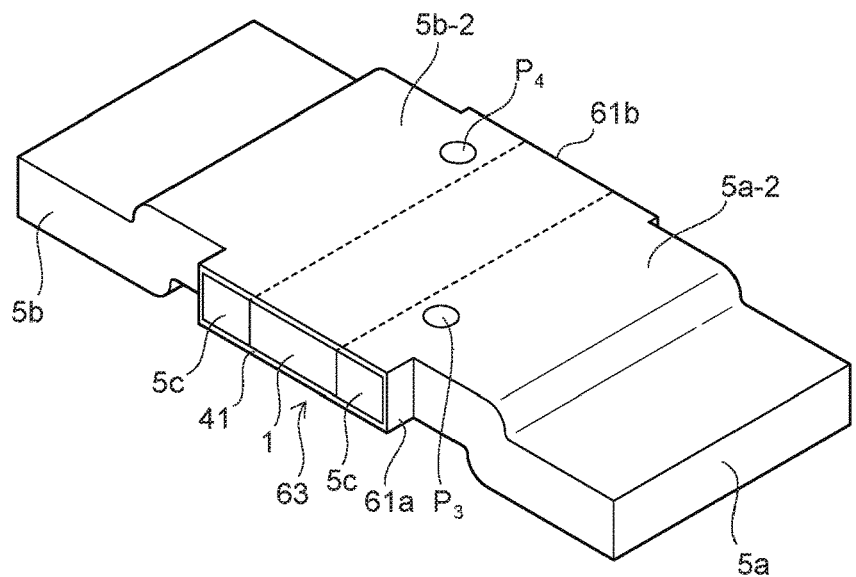
FIG. 8A is a perspective view illustrating an example of a resistor that can be used for the current detecting device in accordance with a seventh embodiment.

FIG. 8A is a perspective view illustrating an example of a resistor that can be used for the current detecting device in accordance with the seventh embodiment of the present invention.

In this embodiment, almost the entire surface of the resistor is covered with the electrically conductive metal film 41. A side portion of the resistor including a resistive element 1 is made to protrude. A first protruding portion 61a formed on one side face forms an exposed face 63 where the resistive element 1 and the electrodes 5a and 5b are partially exposed. The resistance value can be adjusted with the first protruding portion 61a partially cut out.

According to such a method, a portion that protrudes toward a side face side relative to the electrode width is machined. Therefore, the current path is not blocked. Therefore, the resistance value can be finely adjusted with high precision, and favorable characteristics of the resistor can be maintained without excessive influence on the potential distribution.

It should be noted that $P_3$ and $P_4$ denote the positions of marks where bonding is to be performed, and can be formed through creation of recesses with a punch, for example.

It should be noted that the resistive element 1 and the electrodes 5a and 5b are also exposed on a side face of a second protruding portion 61b that is formed on the side opposite to the first protruding portion 61a.

Figure 8B:
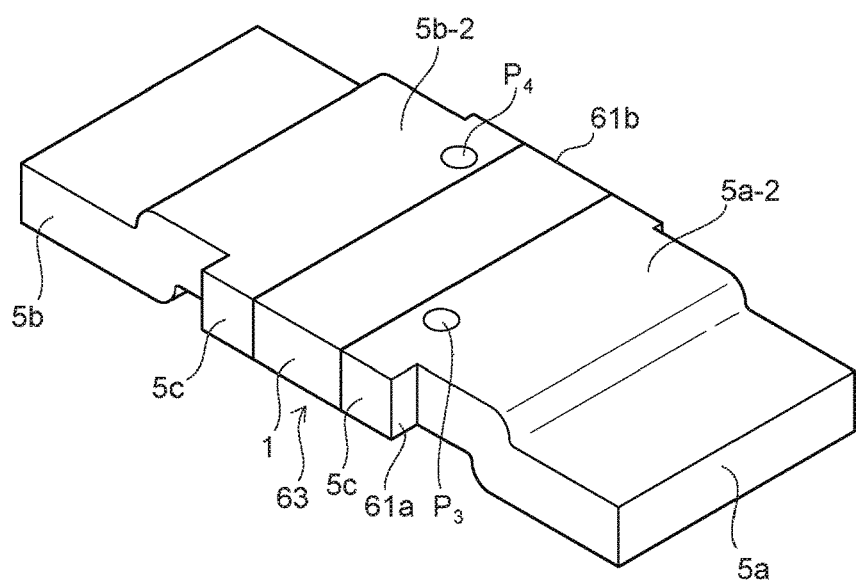
FIG. 8B is a perspective view illustrating an example in which a metal film is not formed or an example in which a metal film is omitted in FIG. 8A.

FIG. 8B is a perspective view illustrating an example in which the metal film 41 in FIG. 8A is omitted. The resistive element 1 and the electrodes 5a and 5b are butt-joined together. $P_3$ and $P_4$ are formed in the electrode portions through creation of recess portions with a punch, for example.

A resistor having no metal film 41 formed thereon has the structure in FIG. 8B. Even for such a resistor, the resistance value can be adjusted as long as the first protruding portion 61a is formed and is partially cut out.

Figure 9A:
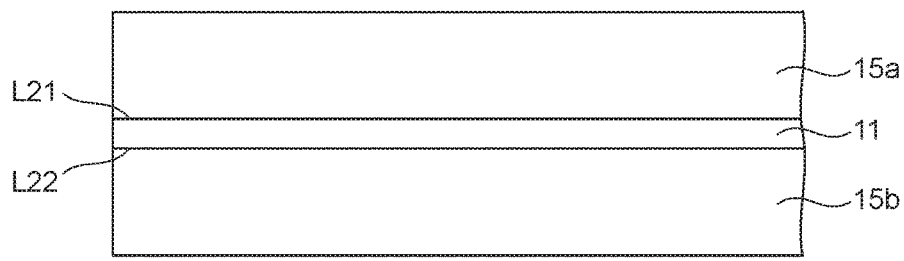
FIGS. 9A(a), 9A(b) and 9A(c) are views of steps illustrating a method for producing a current detecting device in accordance with the seventh embodiment.
Figure 9A:
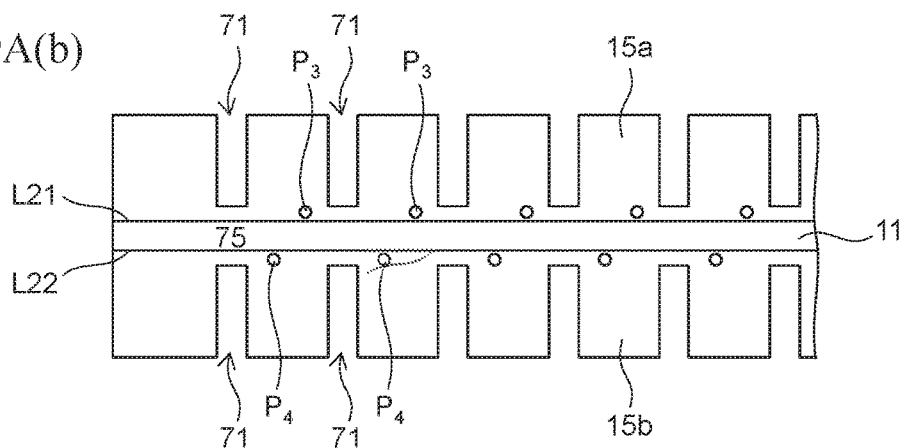
Figure 9A:
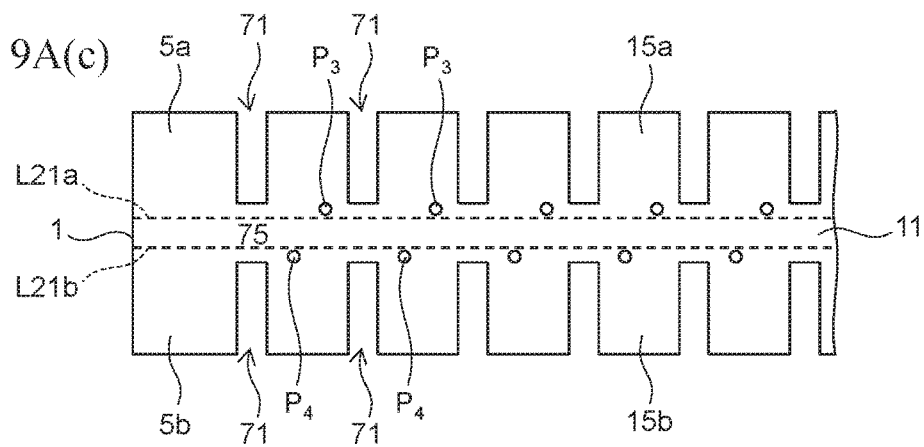
Figure 9B:
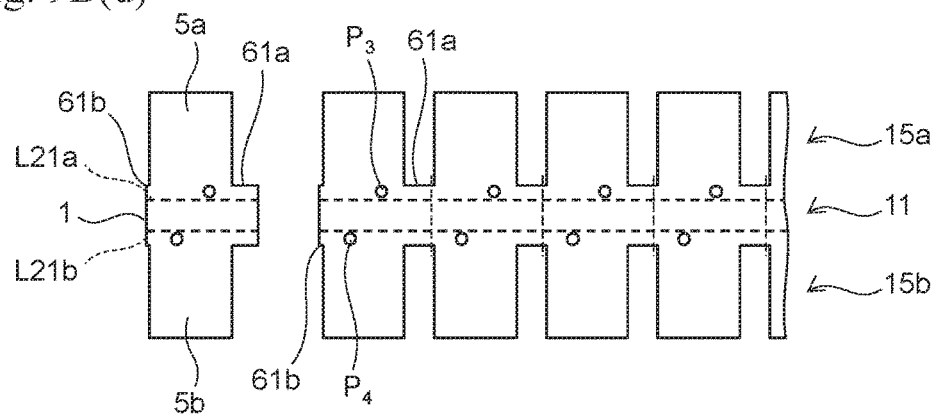
FIGS. 9B(d), 9B(e) and 9B(f) are views of steps illustrating a method for producing the current detecting device in accordance with the seventh embodiment.
Figure 9B:
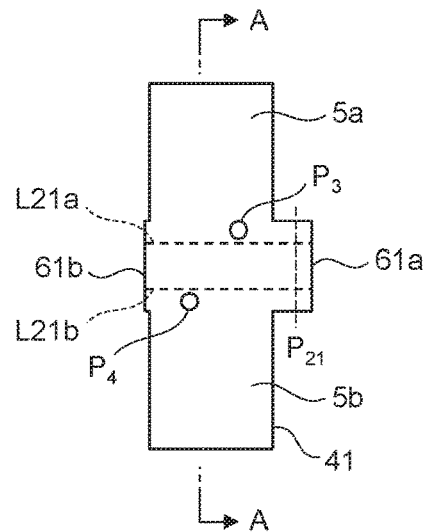
Figure 9B:
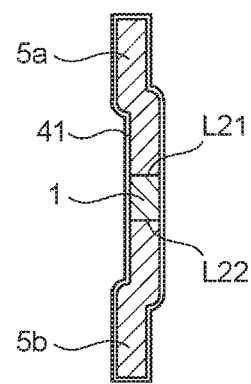

Next, the steps of producing such a resistor will be briefly described. FIGS. 9A(a), 9A(b) and 9A(c) are views of steps illustrating a method for producing the current detecting device in accordance with the seventh embodiment. FIGS. 9B(d), 9B(e) and 9B(f) are views following FIGS. 9A(a), 9A(b) and 9A(c).

As illustrated in FIG. 9A(a), the long resistive material 11 and the long electrode materials 15a and 15b are prepared as hoop materials and their side faces are butt-joined together. Then, the butt-joined side faces are welded together using a laser beam, an electron beam, or the like, whereby joint portions L21 and L22 are formed.

Next, as illustrated in FIG. 9A(b), cutout grooves 71 are formed by partially cutting out the side portions of the electrode material portions, which are the hoop materials, in a direction toward the inner side from the opposite outer sides by an amount corresponding to a predetermined width. Ends of the cutout grooves 71 do not reach the resistive material 11, and slightly leave the electrode materials. This is in order to secure the connection strength, for example. Further, marks $P_3$, $P_4$ to be used for bonding are formed (recesses are formed with a punch). Accordingly, a shape is provided in which a plurality of structures to become future resistors are connected together at a connection portion 75 between the cutout grooves 71. Then, the electrode portions are bent to obtain given shapes as necessary.

Next, the metal film (41) is formed as illustrated in FIG. 9A(c). For example, Ni—P is formed through electroless plating. The coating method used may also be electrolytic plating, vapor deposition, sputtering, or the like. Electroless plating is preferable as it can form a uniform, strong film. Accordingly, the entire surface, including the front, rear, and side surfaces, of the hoop materials can be coated. The marks $P_3$ and $P_4$ are formed with about depths that allow the marks $P_3$ and $P_4$ to be viewed even after the metal film 41 is formed.

As illustrated in FIG. 9B(d), the plate is cut into individual pieces at the connection portion 75 in the splitting (chip forming) step. In FIG. 9B(d), each member obtained through splitting at the cut position indicated by the dashed line has the second protruding portion 61b on the left side in the drawing and has the first protruding portion 61a on the side opposite thereto. Since the plate is cut after the metal film 41 is formed on the entire surface thereof, the resistive element and the electrodes are exposed on a side face side of each of the first protruding portion 61a and the second protruding portion 61b.

As illustrated in FIG. 9B(e), the first protruding portion 61a is cut at a position $P_{21}$, for example, so that the resistance value is adjusted.

In the example illustrated in FIG. 9B(e), prior to the step of obtaining the resistive element 1 through cutting, the resistance value is measured in advance to determine the amount of adjustment of the resistance value and thus calculate the amount of cutting to be performed corresponding to the determined amount of adjustment of the resistance value, and then, the first protruding portion 61a is cut across its entire width. Alternatively, it is also possible to determine the width of a resistive element in advance in accordance with a target product to be produced, and form a cutout in accordance with the width of the resistive element. Examples of the method for forming a cutout include stamping the plate with a punch and grinding the plate with a grinder.

Through the aforementioned steps, a structure is obtained where the resistive element 1 is exposed on the side portions of the resistor. In addition, the electrodes 5a and 5b are also partially exposed as a region including parts of the electrode portions is cut out.

As illustrated in FIG. 9B(f), the metal film 41 is formed on the entire surface. Such a structure is suitable for a case where bonding wires are welded. In addition, the metal film 41 is also formed over the ends of the electrodes, including the top, bottom, and end surfaces thereof. Thus, a favorable joined state is obtained in soldering. As illustrated in the steps of FIGS. 9A(b) to 9A(c), the electrode portions are held by being connected with the resistive element 1 portion. Therefore, the metal film can also be formed on the ends of the electrodes.

Figure 10:
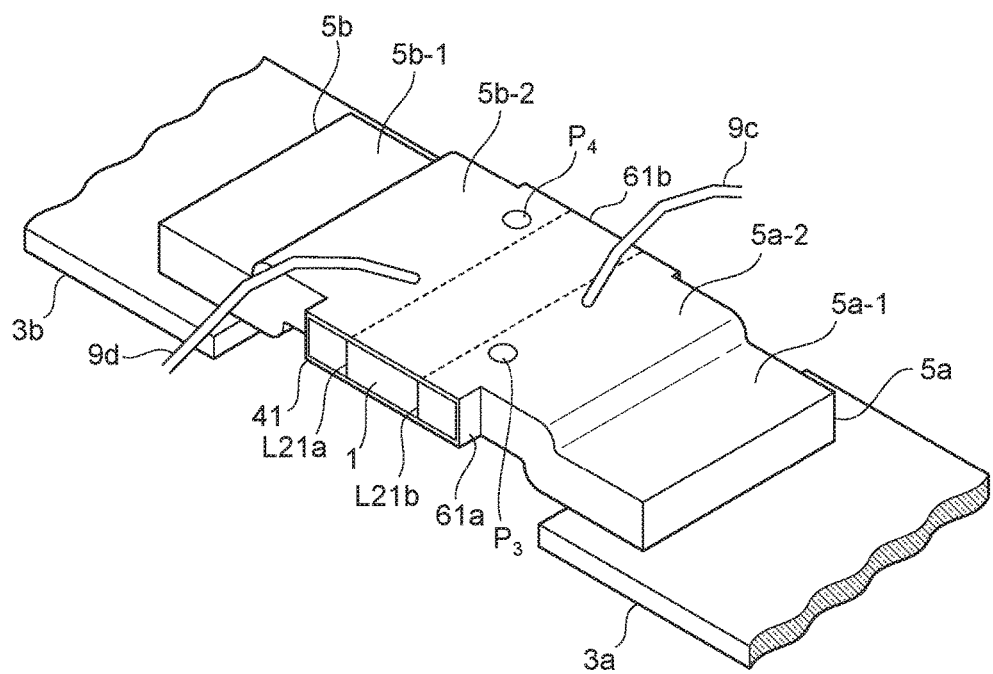
FIG. 10 is a perspective view illustrating a mount state of the current detecting device in accordance with the seventh embodiment.

FIG. 10 is a perspective view illustrating a mount state of the current detecting device in accordance with the seventh embodiment. The positions of the marks $P_3$ and $P_4$ are detected with an image recognition device to determine the bonding positions, so that wires 9c and 9d are bonded at portions beside the marks $P_3$ and $P_4$, respectively. The positions where the marks are formed can be modified as appropriate in accordance with the positions of bonding to be performed.

Figure 11:
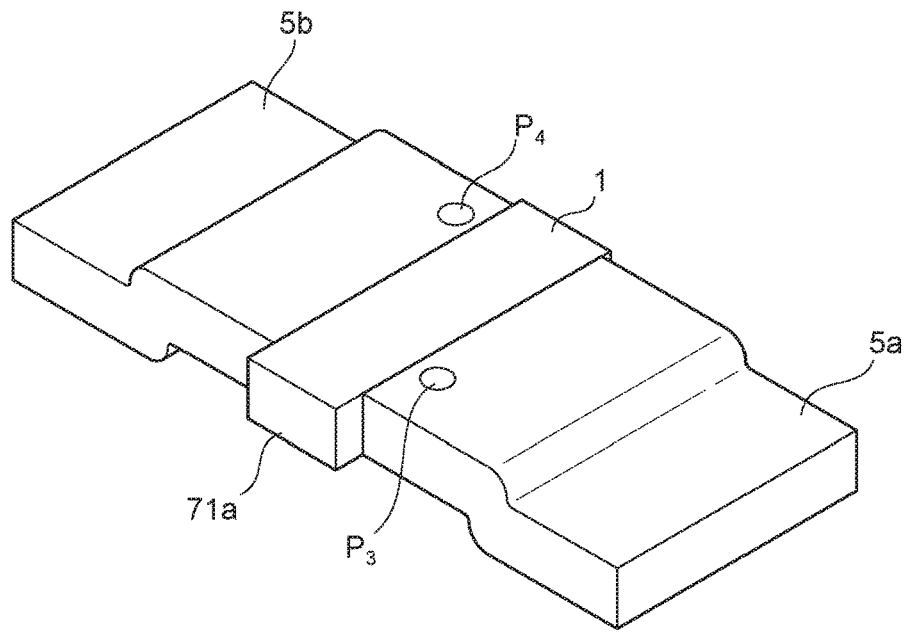
FIG. 11 is a perspective view illustrating a first variation of the current detecting device in accordance with the seventh embodiment.

FIG. 11 is a perspective view illustrating a first variation of the protruding portion of the current detecting device in accordance with the seventh embodiment. This view illustrates an exemplary configuration in which the metal film 41 is omitted or the metal film 41 is not formed. A first protruding portion 71a is formed such that only the resistive element 1 protrudes. Such a structure can be implemented by allowing the terminal ends of the cutout grooves 71 to reach the resistive material 11 in FIG. 9A(b).

Figure 12:
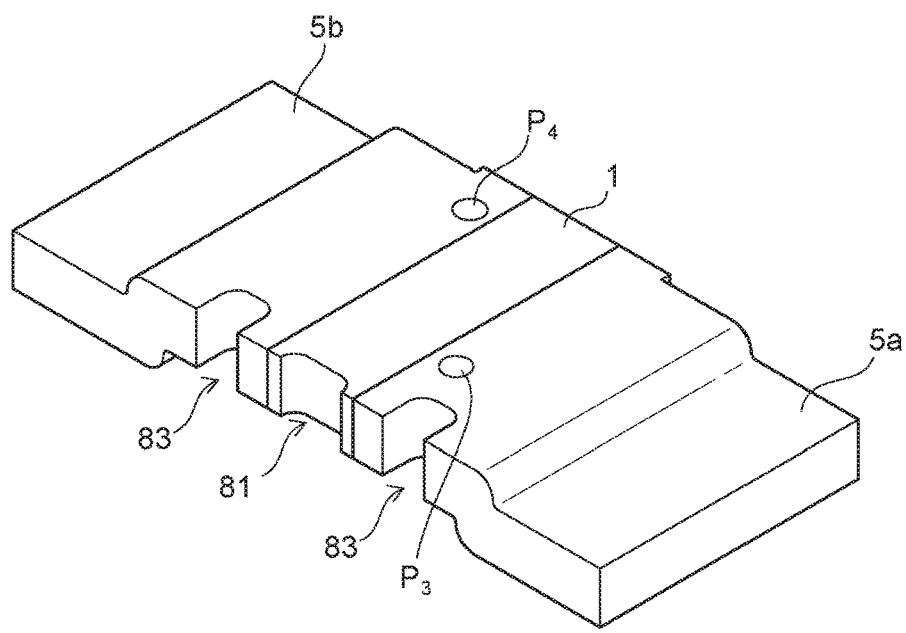
FIG. 12 is a perspective view illustrating a second variation of the current detecting device in accordance with the seventh embodiment.
Figure 13:
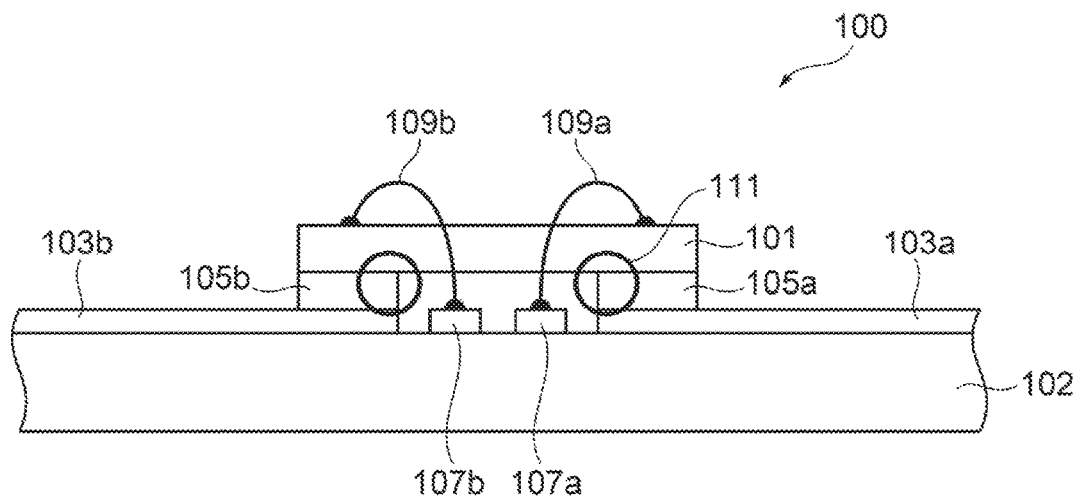
FIG. 13 is a side view illustrating an example of a mount structure of a shunt resistor as an example of a current detecting device (current detecting resistor) described in Patent Literature 1.
Figure 14:
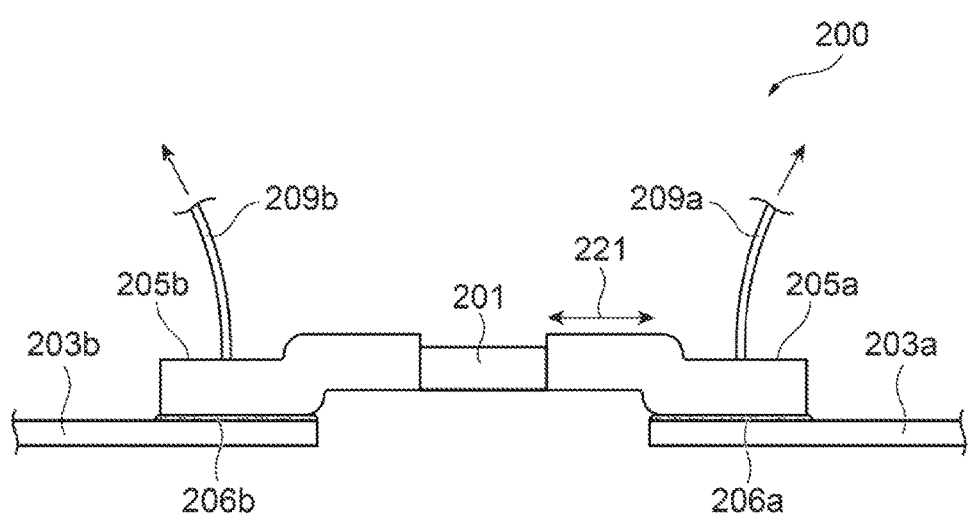
FIG. 14 is a side view illustrating an exemplary configuration of a resistor with a so-called butt joint structure where a resistive element and electrodes are connected together in the perpendicular direction.

FIG. 12 is a perspective view illustrating a second variation of the protruding portion of the current detecting device in accordance with the seventh embodiment. This view illustrates an exemplary configuration in which the metal film 41 is omitted or the metal film 41 is not formed. Recess portions are formed at opposite ends of the resistor on one side thereof, whereby a variation of the projecting portion is formed on one side face of the resistive element 1. That is, an effective projecting portion is formed by providing a cutout 81, which is obtained by partially cutting out only the resistive element 1 for adjusting the resistance value, and recess portions 83 and 83 formed on the electrodes 5a and 5b that are formed on opposite sides of the cutout 81.

It should be noted that for the recess portions 83 and 83 formed on the electrodes 5a and 5b, feed holes that have been provided in the hoop materials from before the hoop materials are cut into individual pieces, can be used.

Although a variety of variations are illustrated above, those skilled in the art may freely conceive of further variations, and such variations are also within the scope of the present invention.

As described above, according to each embodiment of the present invention, in a resistor having terminal portions, which are solder-connected to wires, on opposite ends of the body portion of the resistor, bonding wires functioning as voltage detecting terminals are connected directly or indirectly to a resistive element at voltage detection positions that are located on a further inner side than the inner ends of the soldered regions.

As described above, as wire bonding can be performed in a region on the inner side while avoiding the soldered regions, resistance across the voltage detection positions, which are the voltage detecting terminals, remains unchanged even when the joint state of the resistive element and the wire patterns has changed in the direction in which the distance between the opposite inner ends of the joint regions, which are the soldered regions, becomes long, due to peel-off of the solder caused by electromigration at the joint portions of the resistive element and the wire patterns or cracks generated by heat shrinkage, shocks, or the like. Therefore, high current detection accuracy can be maintained over a long period of time.

As a variation, it is also possible to provide other structures for avoiding bonding in the soldered regions, for example, provide circular holes in a region limited to a certain extent, which includes the connection positions, as structures to regulate the positions to be connected with bonding wires. Besides, it is also possible to provide marks at the target connection positions.

In the aforementioned embodiments, structures and the like that are illustrated in the attached drawings are not limited thereto, and can be changed as appropriate within the range that the advantageous effects of the present invention can be exerted. Besides, such structures and the like can be changed as appropriate within the spirit and scope of the present invention.

Each constituent element of the present invention can be freely selected or not selected, and an invention that includes such selected element is also included in the present invention.

INDUSTRIAL APPLICABILITY

The present invention is applicable to current detecting devices.

All publications, patents, and patent applications cited in this specification are all incorporated by reference into this specification.

The invention claimed is:
1. A current detecting device comprising:
a current detecting resistor extending a length direction, the current detecting resistor including a pair of electrodes and a resistive element electrically connected in series in the length direction with the resistive element being in middle between the pair of electrodes, wherein each of the electrodes comprises first and second sections arranged in the length direction, and the first section is located closer in the length direction to the resistive element than the second section;
a pair of lands on which the current detecting resistor is mounted to supply electricity to the resistive element, wherein the second sections of the pair of electrodes sit, respectively, on the pair of lands via a solder layer to establish direct electrical contact between the pair of lands and the second sections of the pair of electrodes, whereas the first sections of the pair of electrodes are devoid of any direct electrical contact with the pair of lands so that the first sections of the pair of electrodes are electrically connected to the pair of lands solely through the second sections thereof; and
a pair of wires connected, respectively, to the first sections of the pair of electrodes for detection of voltage across the resistive element generated by supply of the electricity from the pair of bonds to the second sections of the pair of electrodes.

2. The current detecting device according to claim 1, wherein the pair of electrodes and the resistive element are butt-joined together in series in the length direction.

3. The current detecting device according to claim 2, wherein the current detecting resister has a thickness in a thickness direction in which the second sections of the pair of electrodes, and the pair of bonds are layered, and each electrode is formed with a step between the first and second sections so that the first section is formed stepped up or down in the thickness direction from the second section.

4. The current detecting device according to claim 3, wherein the current detecting resister has upper and lower surfaces arranged in the thickness direction, and the first section of the pair of electrodes has a thickness in the thickness direction greater than a thickness of the resistive element, and further Wherein the pair of electrodes and the resistive element are connected so that the resistive element has an upper surface recessed down from upper surfaces of the first section of the pair of electrodes.

5. The current detecting device according to claim 1, wherein the current detecting resistor has a width in a width direction in perpendicular to the length direction and in parallel to the pair of lands, and the current detecting resistor has side surfaces arranged in the width direction, and further wherein the resistive element comprising a side surface protruding in the width direction beyond side surfaces of the second sections of the pair of electrodes.

6. The current detecting device of claim 1, further comprising:
a metal film formed to cover the current detecting resistor, wherein the resistive element is partially exposed from the metal film.

7. A current detecting device comprising:
a current detecting resistor including a pair of electrodes and a resistive element;
a pair of lands on which the current detecting resistor is adapted to be mounted;
connection portions adapted to connect the two electrodes and the two lands, respectively; and
a pair of wires connected to the two respective electrodes and adapted to detect a voltage, wherein positions where the two wires are connected to the two respective electrodes are located in regions on a further inner side than inner ends of the connection portions, and further wherein
ends of the pair of electrodes and the resistive element are butt-joined together,
each electrode has a difference in height between a side connected to the resistive element and a side connected to one of the lands,
at least one of the two electrodes has a protruding face that is thicker than the resistive element and has a difference in height from a surface of the resistive element, and
one of the wires is connected to the protruding face.

* * * * *